United States Patent
Benoit et al.

(10) Patent No.: US 12,158,488 B2
(45) Date of Patent: Dec. 3, 2024

(54) COMPUTER-IMPLEMENTED METHOD FOR RECONSTRUCTING THE TOPOLOGY OF A NETWORK OF CABLES, USING A GENETIC ALGORITHM

(71) Applicant: COMMISSARIAT A L'ENERGIE ATOMIQUE ET AUX ENERGIES ALTERNATIVES, Paris (FR)

(72) Inventors: Jaume Benoit, Palaiseau (FR); Moussa Kafal, Les Ulis (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 348 days.

(21) Appl. No.: 16/636,625

(22) PCT Filed: Aug. 7, 2018

(86) PCT No.: PCT/EP2018/071437
§ 371 (c)(1),
(2) Date: Feb. 4, 2020

(87) PCT Pub. No.: WO2019/030246
PCT Pub. Date: Feb. 14, 2019

(65) Prior Publication Data
US 2020/0371150 A1    Nov. 26, 2020

(30) Foreign Application Priority Data

Aug. 11, 2017 (FR) ........................................ 1757650

(51) Int. Cl.
*G01R 31/08* (2020.01)
*G01R 31/11* (2006.01)
(Continued)

(52) U.S. Cl.
CPC ............ *G01R 31/088* (2013.01); *G01R 31/11* (2013.01); *G06F 30/18* (2020.01); *G06F 30/27* (2020.01)

(58) Field of Classification Search
CPC ..................................................... G01R 31/088
See application file for complete search history.

(56) References Cited

U.S. PATENT DOCUMENTS

| | | | |
|---|---|---|---|
| 2002/0180954 A1* | 12/2002 | Qian ................... | G01M 11/3145 356/73.1 |
| 2006/0182269 A1 | 8/2006 | Lo et al. | |
| 2007/0220340 A1* | 9/2007 | Whisnant ............ | G06F 11/0748 714/33 |

FOREIGN PATENT DOCUMENTS

| | | |
|---|---|---|
| CN | 102 982 394 A | 3/2013 |
| CN | 103 036 234 B | 9/2014 |

(Continued)

OTHER PUBLICATIONS

Ramkumar, et al., "Les Algorithmes Génétiques", 2007.
Fletcher, "Practical methods of optimization", John Wiley & Sons, vol. 1, 2013.

*Primary Examiner* — Hyun D Park
(74) *Attorney, Agent, or Firm* — Baker Hostetler

(57) ABSTRACT

A computer-implemented iterative method for reconstructing the topology of a cable network, includes the steps of: obtaining a measured time reflectogram $R_m$ from a signal previously injected into the cable network, initially simulating a plurality of cable network hypotheses ($H_{i,j}$), and then iteratively executing the following steps: obtaining, for each simulated cable network hypothesis ($H_{i,j}$), an associated simulated time reflectogram $R_m$, evaluating, for each simulated cable network hypothesis ($H_{i,j}$), an error criterion $E(R_{i,j}-R_m)$ between the measured time reflectogram $R_m$ and the simulated time reflectogram $R_m$, applying, to the simu- (Continued)

lated cable networks, an optimization algorithm having the function of producing a plurality of modified cable networks having, overall, a reduced error criterion $E(R_{i,j}-R_m)$, replacing the simulated cable networks from the previous iteration with the modified cable networks for the following iteration.

8 Claims, 8 Drawing Sheets

(51) Int. Cl.
*G06F 30/18* (2020.01)
*G06F 30/27* (2020.01)

(56) References Cited

FOREIGN PATENT DOCUMENTS

| CN | 104 134 104 A | 11/2014 |
| CN | 104 240 150 A | 12/2014 |
| CN | 103 633 739 B | 5/2015 |
| CN | 103 701 117 B | 7/2015 |
| CN | 105 552 892 A | 5/2016 |
| WO | 2014/180663 A1 | 11/2014 |

* cited by examiner

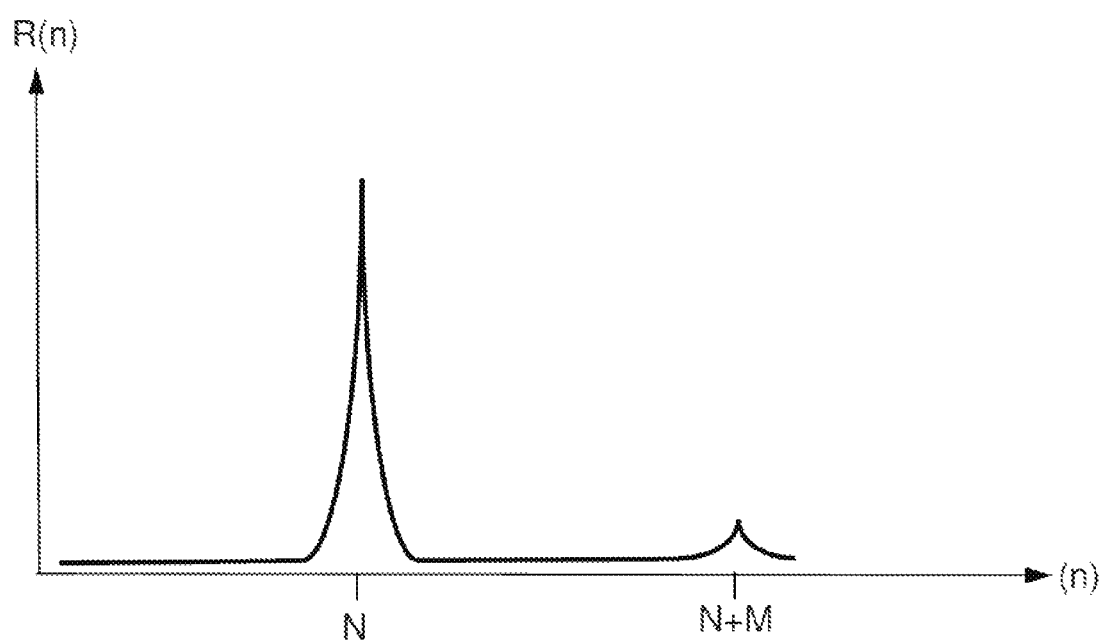
FIG.1bis

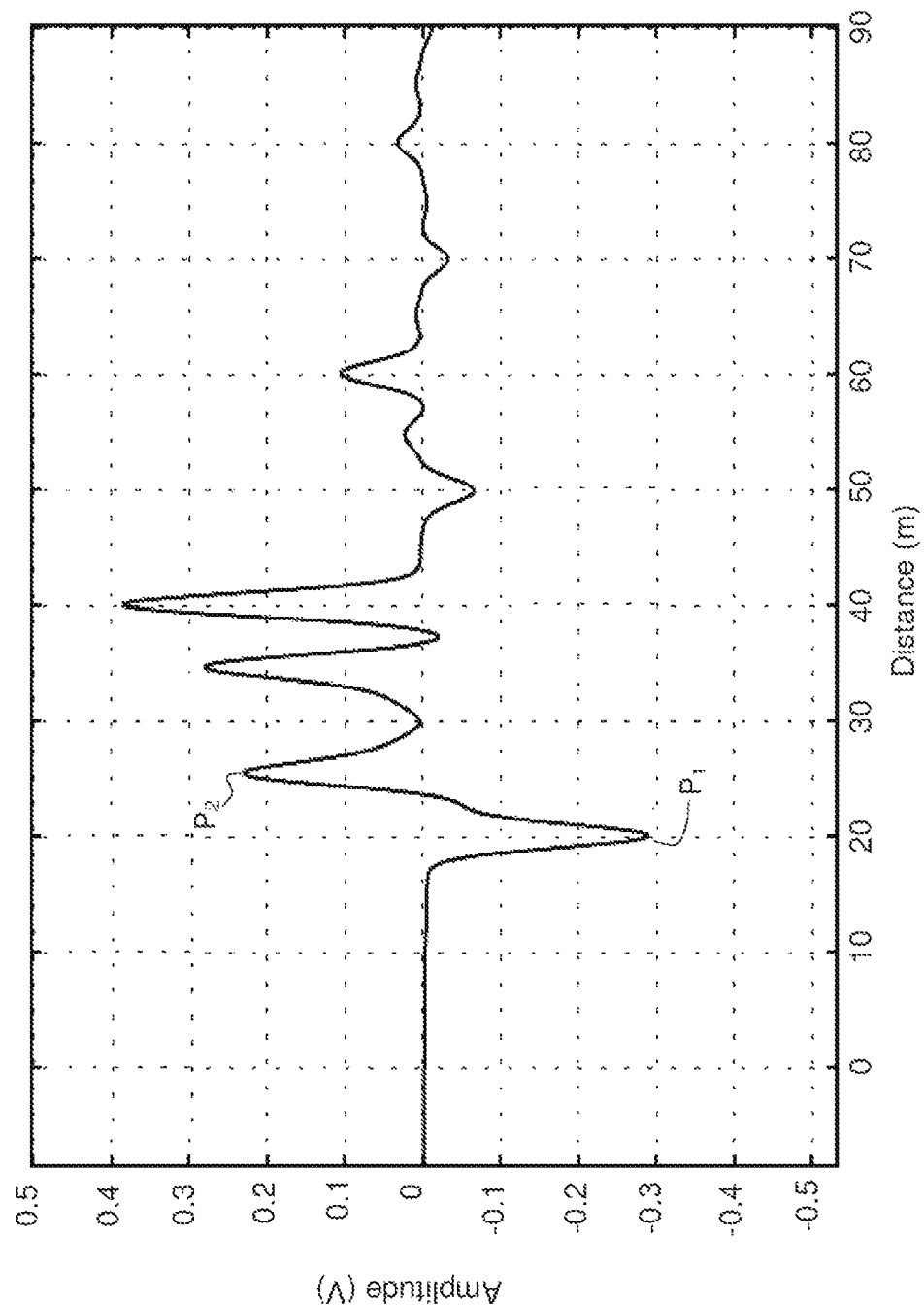

COMPUTER-IMPLEMENTED METHOD FOR RECONSTRUCTING THE TOPOLOGY OF A NETWORK OF CABLES, USING A GENETIC ALGORITHM

CROSS-REFERENCE TO RELATED APPLICATIONS

This application is a National Stage of International patent application PCT/EP2018/071437, filed on Aug. 7, 2018, which claims priority to foreign French patent application No. FR 1757650, filed on Aug. 11, 2017, the disclosures of which are incorporated by reference in their entirety.

FIELD OF THE INVENTION

The invention relates to the field of the technical analysis and monitoring of complex cable networks. More precisely, it pertains to a method for reconstructing the topology of a cable network. The invention aims to propose a method for determining the topology of a network, that is to say the junction points between a plurality of cables, the number of cables connected at each point and their respective lengths, but also the characteristic impedances of each cable section and the impedances of the loads at the end of the cable. The proposed method is based on the use of a time reflectogram obtained by injecting a controlled signal into the cable network and then by measuring the signal reflected off the various impedance discontinuities of the network. The invention thus relates more generally to the field of what are called reflectometry methods, which aims to provide information about a cable or a cable network from a reflectogram.

BACKGROUND

Cables are ubiquitous in all electrical systems, for supplying power or transmitting information within buildings or vehicles such as aircraft. These cables are subjected to the same constraints as the systems that they link, and may be subject to failures. It is therefore necessary to be able to analyze their state and to provide information about the detection of faults, but also their location and their type, so as to assist with maintenance. Conventional reflectometry methods enable this type of test.

Reflectometry methods use a principle close to that of radar: an electrical signal, the probe signal or reference signal, which is more often than not high-frequency or wideband, is injected at one or more locations of the cable to be tested. The signal propagates in the cable or the network and returns a portion of its power when it encounters an electrical discontinuity. An electrical discontinuity may be caused for example by a connection, by the end of the cable or by a fault or more generally by an interruption of the propagation conditions for the signal in the cable. It is caused by a fault that locally modifies the characteristic impedance of the cable by bringing about a discontinuity in its linear parameters.

Analyzing the signals returned to the injection point makes it possible to deduce therefrom information about the presence and the location of these discontinuities, and therefore possible faults. An analysis in the time or frequency domain is usually performed. These methods are denoted using the acronyms TDR, stemming from the expression "time domain reflectometry", and FDR, stemming from the expression "frequency domain reflectometry".

SUMMARY OF THE INVENTION

The invention applies to any type of cable network, notably electric cables, in particular power transmission cables or communication cables, in fixed or mobile installations. The cables in question may be coaxial, bifilar, in parallel rows, in twisted pairs or in another arrangement, provided that it is possible to inject a reflectometry signal into them at a point of the cable network and to measure its reflection at the same point or at another point.

The aim of the present invention is notably to make it possible to reconstruct the topology of complex cable networks whose layouts are not available or for which urgent intervention requires immediate knowledge of the topology of the network. This type of problem exists notably for electric or power cable networks within a building or within a vehicle. An engineer wishing to repair the network following the detection of an electrical problem may need precise knowledge of the topology of the network in order to help him to establish his diagnosis. Moreover, some buildings have a level of confidentiality which, by nature, prohibits the dissemination of the layouts of the electrical network.

Another problem is specific to the field of reflectometry methods applied to the detection of faults.

FIG. 1 shows a diagram of a system 100 for analyzing a fault in a transmission line L, such as a cable, using a conventional time reflectometry method from the prior art. Such a system primarily comprises a generator GEN for generating a reference signal. The digital reference signal that is generated is converted into analog via a digital-to-analog converter DAC and is then injected at a point of the transmission line L by way of a directional coupler CPL or any other device for injecting a signal into a line. The signal propagates along the line and reflects off the singularities that it contains. In the absence of a fault on the line, the signal reflects off the endpoint of the line if the termination of the line is not matched. In the presence of a fault on the line, the signal partially reflects off the impedance discontinuity caused by the fault. The reflected signal is propagated back to a measurement point, which may be the same as the injection point or different. The back-propagated signal is measured via the directional coupler CPL and then converted into digital by an analog-to-digital converter ADC. A correlation COR is then made between the measured digital signal and a copy of the digital signal generated prior to injection in order to produce a time reflectogram R(t) corresponding to the intercorrelation between the two signals.

As is known in the field of time reflectometry-based diagnostic methods, the position $d_{DF}$ of a fault on the cable L, in other words its distance to the injection point of the signal, is able to be obtained directly based on the measurement, on the calculated time reflectogram R(t), of the duration $t_{DF}$ between the first amplitude peak shown on the reflectogram and the amplitude peak corresponding to the signature of the fault.

FIG. 1b is shows an example of a reflectogram R(n) obtained using the system from FIG. 1, in which a first amplitude peak is observed at an abscissa N and a second amplitude peak is observed at an abscissa N+M. The first amplitude peak corresponds to the reflection of the signal at the injection point into the cable, while the second peak corresponds to the reflection of the signal off an impedance discontinuity caused by a fault.

Various known methods may be contemplated to determine the position $d_{DF}$. A first method consists in applying the relationship linking distance and time: $d_{DF}=V_g \cdot t_{DF}/2$ where $V_g$ is the propagation speed of the signal in the cable. Another possible method consists in applying a proportionality relationship of the type $d_{DF}/t_{DF}=L_c/t_0$, where $L_c$ is the length of the cable and to is the duration, measured on the reflectogram, between the amplitude peak corresponding to the impedance discontinuity at the injection point and the amplitude peak corresponding to the reflection of the signal off the endpoint of the cable.

An analysis device (not shown in FIG. 1) is responsible for analyzing the reflectogram R(t) in order to deduce therefrom information about the presence and/or location of faults, as well as the possible electrical characteristics of the faults. In particular, the amplitude of a peak in the reflectogram is linked directly to the reflection coefficient of the signal off the impedance discontinuity caused by the fault.

Detecting and locating faults by way of a reflectometry system is of great benefit because the earlier a fault is detected, the more it is possible to intervene in order to correct/repair the fault before the damage is too great. Thus, monitoring the state of health of a cable makes it possible to maintain reliable use of the cable throughout its entire service life.

In the case of a complex cable network comprising numerous interconnections, analyzing a reflectogram in order to characterize the presence of faults is more difficult to implement since the junctions between the various cables of the network as well as the loads at the end of the cables also cause signal reflections that may be superimposed on those resulting from a fault. In particular, multiple reflections may exist between a plurality of junctions or more generally a plurality of singular points of the network. The superimpositions of multiple reflections of the signal at various singular points of the network may cancel each other out, amplify one another or combine so as to create numerous stray peaks in the reflectogram. Furthermore, the number of signal reflections tends to increase exponentially with the number of cables interconnected in the network. Thus, complex cable networks produce reflectograms that are very complex to analyze.

In particular, even if a peak characteristic of a fault is able to be identified in a reflectogram, the location of the fault may be ambiguous because the reflectogram makes it possible only to ascertain the distance between the fault and the injection point of the signal, but not the branch of the network on which the fault is located. To illustrate this phenomenon, an exemplary cable network comprising five branches and two junctions is shown in FIG. 2a. The reflectogram associated with this network is illustrated in FIG. 2b, considering the injection and the measurement of the signal at point E of the network. In the reflectogram, a first peak P1 of negative amplitude that corresponds to the first junction J1 is identified, and then a second peak P2 that corresponds to a fault DF. It is not possible to precisely locate this fault DF because it may be located either on the branch L2 at the point DF' or on the branch L3 at the point DF. The other peaks of the reflectogram correspond to direct or multiple reflections off the endpoints of the various cables and off the second junction J2.

It is therefore seen that the methods for monitoring the state of health of a cable network by way of reflectometry are not sufficient when the cable network is complex, that is to say when it has many branches and interconnections.

There is therefore a need for a method for determining the topology of a cable network without a priori information. Knowledge of the topology of the network may be combined with a conventional reflectometry method in order to be able to better use a reflectogram in order to identify and locate possible faults. Specifically, if the singular points of the network, that is to say the junctions between cables and the lengths of the various branches of the network, are known, it is possible to match certain peaks of a reflectogram to these singular points and thus discriminate between the peaks that correspond to physical elements of the network and those that correspond to faults.

American patent application US20060182269 describes a method for reconstructing the topology of a cable network by using a reflectogram.

The described method is limited to the case of networks in which all of the cables are terminated by an open circuit or a short circuit and have the same characteristic impedance. These hypotheses are not realistic because, in a real case, apparatuses may be connected to the endpoint of the cables with a load that is not matched to the cable. Moreover, all of the cables forming a network are not necessarily of the same type and therefore do not systematically have the same characteristic impedance.

The method proposed in that document consists in gradually reconstructing the cable network by successively analyzing the sign and the value of the amplitude of each peak of a reflectogram. This method has the drawback of being tedious to implement because it is not easily able to be automated. Specifically, it requires a specific search, for each peak of the reflectogram, for the various possible reconstruction hypotheses of the network in order to progress step by step until completely reconstructing the network. Moreover, the method proposed in that document does not make it possible to converge on a single solution but, on the contrary, produces a plurality of ambiguous solutions.

The invention proposes a method for reconstructing the topology of a cable network, which method is automated through the use of an optimization algorithm that may be a genetic algorithm or an algorithm derived from Newton's method. The method has the advantage of converging on one solution or a small number of solutions in a limited time.

One subject of the invention is a computer-implemented iterative method for reconstructing the topology of a cable network, comprising the steps of:

Obtaining a measured time reflectogram $R_m$ from a signal previously injected into the cable network, Initially simulating a plurality of cable network hypotheses, and then iteratively executing the following steps:

Obtaining, for each simulated cable network hypothesis, an associated simulated time reflectogram $R_{i,j}$, Evaluating, for each simulated cable network hypothesis, an error criterion $E(R_{i,j}-R_m)$ between the measured time reflectogram $R_m$ and the simulated time reflectogram $R_{i,j}$, Applying, to said simulated cable networks, an optimization algorithm having the function of producing a plurality of modified cable networks having, overall, a reduced error criterion $E(R_{i,j}-R_m)$, Replacing said simulated cable networks from the previous iteration with said modified cable networks for the following iteration.

According to one particular embodiment of the invention, the optimization algorithm is based on Newton's method.

According to one particular embodiment of the invention, the optimization algorithm is applied independently to each simulated cable network hypothesis in order to modify at least one numerical parameter of the topology of each simulated cable network.

According to one particular embodiment of the invention, the optimization algorithm is a genetic algorithm.

According to one particular embodiment of the invention, the genetic optimization algorithm comprises at least one operation of mutating a simulated cable network in order to obtain a modified cable network.

According to one particular embodiment of the invention, the genetic optimization algorithm comprises at least one operation of crossing over two simulated cable networks in order to obtain a modified cable network, a crossover being applied to the structural topology parameters and the numerical topology parameters of a cable network.

According to one particular embodiment of the invention, the P simulated cable networks that have the lowest error criteria are not modified by the genetic optimization algorithm, P being a predetermined integer at least equal to one.

According to one particular embodiment of the invention, the genetic optimization algorithm comprises at least one operation of crossing over two simulated cable networks in order to obtain a modified cable network, a crossover being applied only to the numerical topology parameters of a cable network.

According to one particular embodiment of the invention, the plurality of simulated cable network hypotheses covers all of the possible cable network structural topology parameters, the structural parameters comprising at least the number of junctions and the number of branches connected to each junction.

According to one variant, the method according to the invention furthermore comprises a step of eliminating the M simulated cable networks that have the highest error criteria before applying the optimization algorithm, M being a predetermined integer at least equal to one.

According to one variant, the method according to the invention comprises a stop test comprising a step of comparing the error criteria of the remaining simulated cable networks with a predetermined second threshold and, if at least one simulated cable network has an error criterion lower than said second threshold, stopping the method.

According to one particular aspect of the invention, the error criterion is a Euclidean distance.

According to one variant, the method according to the invention comprises a step of displaying the reconstructed topology of the cable network on a display device.

According to one variant, the method according to the invention comprises a preliminary step of injecting the signal into the cable network.

Another subject of the invention is a computer program comprising instructions for executing the method for reconstructing the topology of a cable network according to the invention when the program is executed by a processor.

Another subject of the invention is a recording medium able to be read by a processor and on which there is recorded a program comprising instructions for executing the method for reconstructing the topology of a cable network according to the invention when the program is executed by a processor.

BRIEF DESCRIPTION OF THE DRAWINGS

Other features and advantages of the present invention will become more clearly apparent upon reading the following description with reference to the appended drawings, in which:

FIG. 1b is shows an example of a reflectogram obtained with the reflectometry system of FIG. 1 for a single cable, FIG. 2b shows an example of a time reflectogram obtained for the cable network of FIG. 2a, FIG. 3 shows a flowchart detailing the steps for implementing a method for reconstructing the topology of a cable network, according to a first and a second embodiment of the invention.

DETAILED DESCRIPTION

One aim of the method according to the invention is to provide a reconstruction of the topology of a totally or partially unknown network. The information provided by the method comprises the number of junctions or connection points of the network, the number of branches or cable sections connected at each junction, the length of each branch as well as the characteristic impedance of each branch and the value of the impedance of the load at the end of the branch, that is to say at the endpoint of a cable that is not connected to another cable. The method according to the invention is able to provide all of this information in order to produce a complete reconstruction of the topology of a network or provide only some of this information. The amount and the type of information characterizing the topology of a network is a parameter of the invention that is specified by a user.

The invention is applicable to any type of cable network having a tree topology and does not apply to networks having a loop-shaped topology.

Figure 3:
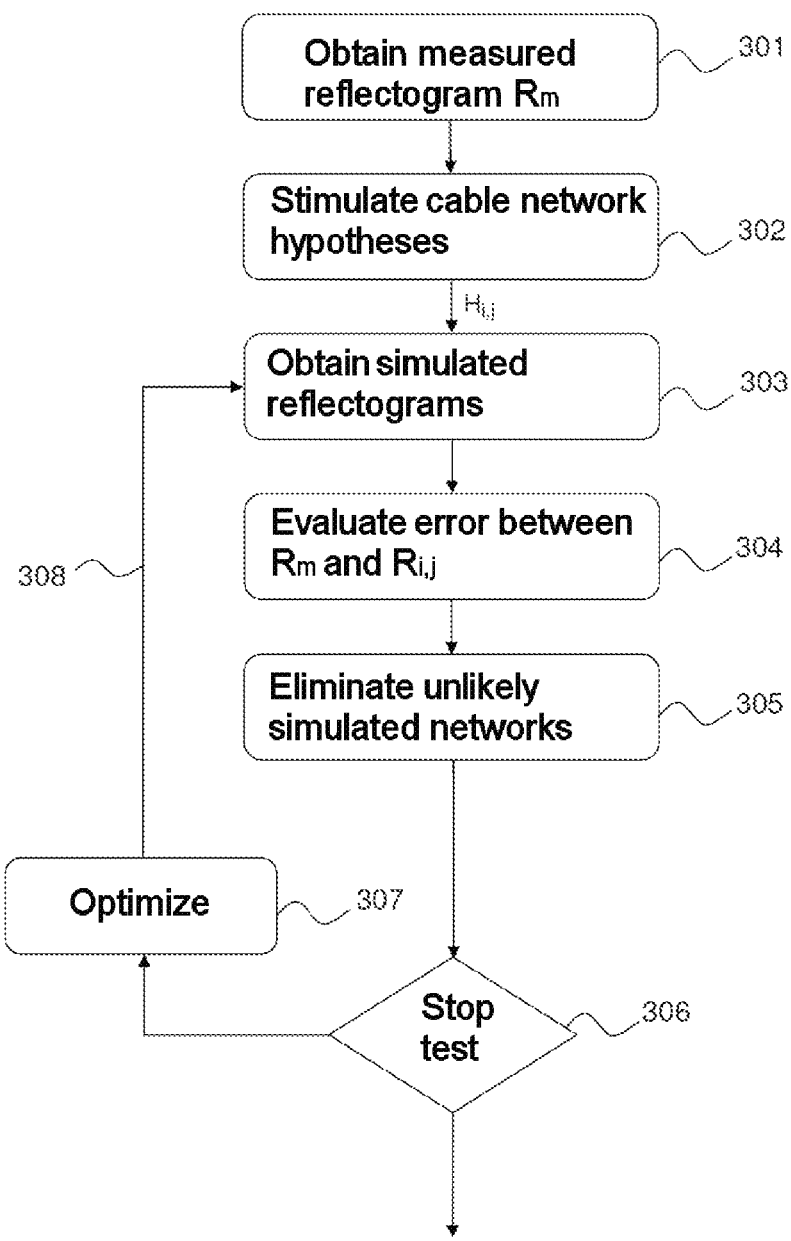

FIG. 3 outlines, in a flowchart, the steps for implementing the method according to a first embodiment of the invention.

In a first step 301 of the method, a time reflectogram $R_m$ is obtained from a reflectometry measurement. As indicated in the preamble, a reflectometry measurement is obtained by injecting a controlled signal at a point of the cable network and then by measuring, at the same point or at a different point of the network, the signal that is propagated back after having undergone multiple reflections off the impedance discontinuities appearing in the cables of the network. The reflectometry measurement may be obtained by way of the device described in FIG. 1 or any other equivalent apparatus for performing the same function. The signal that is used may be of varying nature, and it may be a simple Gaussian signal, a time slot or a pulse or even a more complex signal. Depending on the exact nature of the signal, the time reflectogram $R_m$ is obtained directly by measuring the back-propagated signal, or else by an intercorrelation calculation between this measurement and a copy of the signal injected into the network. In general, any signal measurement containing the information relating to the reflections of the signal off the singular points of the network, that is to say the junctions and the loads at the end of cables, is compatible with the invention. It should be noted that measuring the time reflectogram $R_m$ requires access to only one test port of the network.

In a second step 302 of the method, a plurality of possible cable network topology hypotheses are simulated, taking into account global constraints on the network to be reconstructed, for example the maximum and minimum numbers of branches and junctions that the network may contain, but also bounds on the numerical values of the impedances and the lengths of the branches.

There are two types of parameter for reconstructing a network. On the one hand, these include the structural parameters of the topology of a network, these being the number of junctions and the number of branches connected to each junction. On the other hand, these also include the numerical parameters of the topology, these being the lengths of the branches, the values of the characteristic impedances of the branches and the values of the impedances of the loads at the end of each endpoint of the network.

The set of simulated network hypotheses has to run through all of the possible structural topology parameters and has to comprise a plurality of numerical parameter hypotheses for each structural hypothesis.

One exhaustive possibility consists in simulating all of the numerical parameter values and all of the structural parameters in order to simulate all of the possible hypotheses.

Hereinafter, $H_{i,j}$ denotes a simulated network hypothesis, i being an index indexing a structural parameter hypothesis and j being an index indexing a numerical parameter hypothesis. The index i varies from 1 to $N_{st}$, where $N_{st}$ is the number of possible structural parameter hypotheses. The index j varies within a subset of the set of possible numerical parameter hypotheses, this subset being at most equal to the total set of numerical parameter hypotheses.

Next, for each simulated topology hypothesis, a simulated time reflectogram associated with this topology is determined 303. For this purpose, consideration is given to the same signal as that used to obtain the measured reflectogram $R_m$ and the same conditions for injecting the signal and measuring the back-propagated signal. The back-propagated signal is simulated for example by applying a numerical model of the propagation of the signal through the cables of the simulated network. In particular, this model takes into account the reflection coefficients and the transmission coefficients at each junction or each load that the simulated network contains. A person skilled in the art may use his general knowledge of wave propagation to determine a simulated reflectogram, in particular based on the telegrapher's equations, which make it possible to describe the evolution of the voltage and of the current on an electricity line as a function of distance and time.

$$\frac{\partial v(x,t)}{\partial x} = -Ri(x,t) - L\frac{\partial i(x,t)}{\partial t} \quad (1)$$

$$\frac{\partial i(x,t)}{\partial x} = -Gv(x,t) - C\frac{\partial v(x,t)}{\partial t} \quad (2)$$

The parameters R, L, C, G correspond respectively to the resistance, to the inductance, to the capacitance and to the conductance of the line.

At the end of step 303, a plurality of simulated reflectograms $R_{i,j}$ corresponding to the hypotheses $H_{i,j}$ are obtained.

In the following step 304, an error criterion is calculated for each simulated topology hypothesis between the measured reflectogram $R_m$ obtained in step 301 and the reflectogram $R_{i,j}$ of the simulated network. The error criterion reflects the proximity or the resemblance between the two reflectograms. It may consist of a simple point-to-point difference between the two reflectograms or a more elaborate distance calculation. For example, the error criterion may be equal to the Euclidean norm or norm 2 of the difference between the two reflectograms. The Euclidean norm is equal to the square root of the sum of the squares of the point-to-point difference values between the two reflectograms. Any other distance or norm may be contemplated. The error calculation may also include weightings in order to give priority to certain time values over others.

In step 305, the structural parameter hypotheses that have a high error criterion are eliminated. In other words, at least one index $i_0$ is selected from among the indices indexing the structural parameter hypotheses, and all of the hypotheses $H_{i_0,j}$ are eliminated.

For this purpose, each error criterion calculated in step 303 is compared with a first error threshold, the value of which is a set parameter, so as to eliminate large errors that reflect an excessively large difference between the measured reflectogram and the simulated reflectogram. Another possibility is to set a percentage or a number of simulated network hypotheses to be eliminated. For example, only one structural parameter hypothesis (the least likely) is eliminated at each iteration. If a plurality of numerical hypotheses (index j) are available for each structural hypothesis (index i), a representative error criterion may be assigned to the set of numerical hypotheses for a structural hypothesis, for example by taking an average.

In another variant embodiment, the hypothesis or hypotheses having the highest error criterion or criteria are eliminated independently of the indices i,j.

Step 305 makes it possible to eliminate the topologies whose structural parameters are unlikely.

In the first iteration of the method, a genetic optimization algorithm 307 is then applied to the simulated networks remaining after step 305. The genetic algorithm is applied in parallel to each group of hypotheses $H_{i,j}$ having the same structural parameters but different numerical parameters.

The genetic algorithm modifies the simulated networks, and the modified simulated networks are used as the starting point for a following iteration of the method. In other words, at each new iteration, the simulated networks that are used at the input of step 304 in the previous iteration are replaced 308 with the simulated networks modified by the genetic algorithm 307. In this first embodiment of the invention, the modifications made to the simulated networks relate only to the numerical parameters of the network topologies, that is to say the branch lengths, the values of characteristic impedances of the branches and the values of the impedances of the loads at the end of the cable.

One example of a genetic algorithm is described in reference [1]. This is a metaheuristic optimization algorithm. It consists, at each iteration of the method, in modifying some of the simulated networks through a crossover and/or through mutation. According to the terminology used for genetic algorithms, a crossover and a mutation apply to individuals. An individual corresponds to a simulated network that is represented, in this first embodiment, by a model vector that comprises the various numerical parameters of a topology, that is to say the lengths of the various branches of the network, the values of the characteristic impedances of the various branches of the network as well as the values of the impedances of the loads at the end of each free endpoint of a branch. A crossover is applied to two parent individuals to produce a child individual. The child individual is a modified simulated network that is obtained by combining the two parent individuals. The combination is for example a linear combination weighted as a function of the respective weights assigned to the two parent individuals. The linear combination operation is applied to at least one of the numerical parameters of the topology of a simulated network. The weight associated with an individual is linked directly to the error calculated in step 304. An individual having a low error criterion will thus be assigned a higher weight than an individual having a high error criterion. At the output of step 307, the number of individuals modified is identical to the number of individuals at the input of step 307. The individuals modified through a crossover are each obtained from the crossing over of two parent individuals. The parent individuals to which a crossover is applied are for example drawn randomly from among the individuals present at the input of step 307. The random draw may be uniform or it may be non-uniform. In this second case, individuals having a high weight have a higher probability of being selected for a crossover operation. Moreover, when two individuals are selected to be crossed over, their respective weights may also be used to weight the crossing over of the values of their respective model vectors.

Figure 4A:
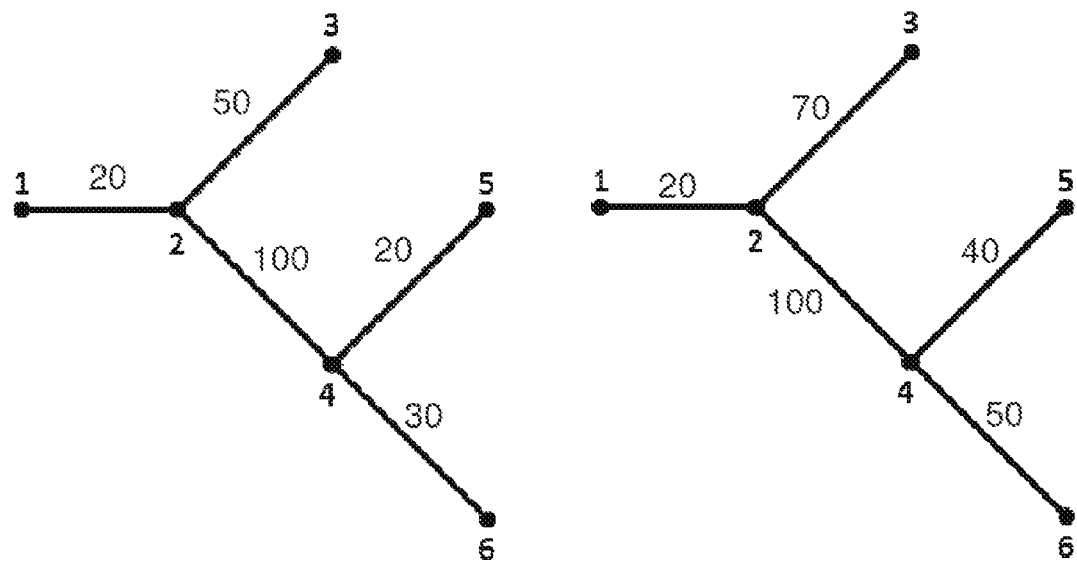
FIGS. 4a and 4b show an illustration of a crossover of two networks having topologies based on identical graphs but different numerical characteristic impedance values.
Figure 4B:
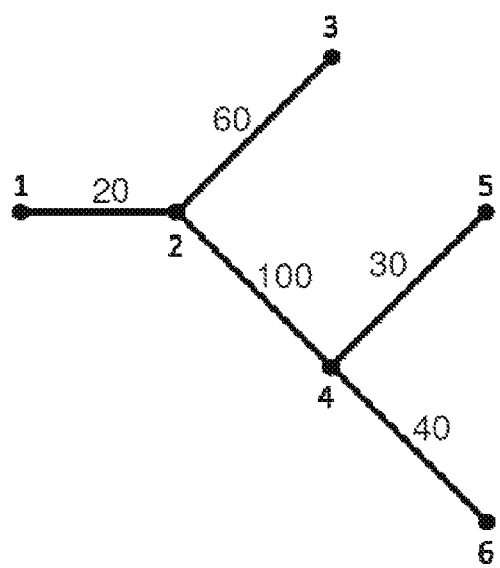

FIGS. 4a and 4b illustrate one example of a crossover of two parent networks having identical structural topology parameters but different numerical topology parameters.

FIG. 4a shows two networks having the same structure (same number of branches and junctions) but different characteristic impedance values for certain branches (represented by numbers on each branch).

FIG. 4b shows a network obtained by crossing over the two networks of FIG. 4a. The characteristic impedances of the branches of the network of FIG. 4b are equal to the averages of the characteristic impedances of the respective branches of the parent networks of FIG. 4a. In this example, the two parent networks have identical weights.

According to one variant embodiment, a mutation operation is applied to a small percentage of the individuals modified through a crossover. The percentage that is chosen is typically less than 1%. A mutation consists in randomly modifying the value of a numerical parameter of an individual's model vector, within the limits of the value bounds imposed by the hypotheses taken for the sought network.

The modified networks obtained at the output of the genetic algorithm 307 replace 308 the simulated networks from the previous iteration in the next iteration, and the method loops back to step 304.

The optimization step 307 allows the numerical parameters of the topology hypotheses to evolve toward the most likely parameters.

From the second iteration of the method, a test for stopping the method 306 is implemented after step 305. If at least one simulated network has an error criterion lower than a predetermined second threshold, then this simulated network is chosen as the most probable one. If a plurality of simulated networks satisfy the stop test 306, the method provides a plurality of solutions. These solutions may then be distinguished using partial knowledge of the real network. The second threshold of the stop test 306 is a parameter of the invention. It may be set by estimating the level of proximity between two reflectograms, from which it may be considered that the two networks associated with these two reflectograms are identical. The second threshold may notably be set through simulation. As an alternative, the stop test may also consist in stopping the method after a certain period and in retaining the simulated networks remaining at the end of step 305, or in retaining only the simulated network having the smallest error criterion.

The method according to the first embodiment of the invention makes it possible to completely reconstruct the topology of an unknown network, that is to say both the structural parameters and the numerical parameters. In one variant embodiment, only some of the numerical parameters may be sought, for example only the lengths of the branches, in order to simplify the implementation of the method. The reconstruction parameters are therefore configurable.

The simulated network or networks selected at the end of the method may be displayed on a screen or any other equivalent interface in order to be viewed by a user.

A description is now given of a second embodiment of the invention in which the genetic optimization algorithm is replaced with an optimization algorithm based on a Newton algorithm as described in [2]. The Newton algorithm or Newton's method is an optimization method for numerically finding a precise approximation of a zero (or root) of a real function of a real variable. The principle of this method is as follows.

Let F be a differentiable function, and the objective of Newton's method is to solve the equation F(x)=0. Starting from an initial value $x_0$, it is possible to construct a linear approximation of the function F(x) close to $x_0$: $F(x_0+h)=F(x_0)+F'(x_0).h$ where F'( ) is the derivative of F( ). The problem then comes down to solving the equation $F(x_0)+F'(x_0).h=0$.

From these observations, it is possible to derive a method through repetition, described by equation (3):

$$x_{k+1}=x_k-F'(x_k)^{-1}.F(x_k) \quad (3)$$

This result is applied in order to implement optimization step 307 of the method according to the second embodiment of the invention. The other steps are identical to those already described in FIG. 3.

The optimization algorithm based on Newton's method is applied independently to each hypothesis $H_{i,j}$.

Equation (3) is applied to the function $F_{i,j}(x)=E(R_{i,j}(x)-R_m)$, where E( ) is the error criterion used in step 304, for example the Euclidean norm, and x is a vector containing all of the numerical topology parameters for a hypothesis $H_{i,j}$, which comprise the lengths of the branches of a network and/or the characteristic impedances of the branches and/or the impedances of the loads at the endpoints of the network. By doing this, the equation $F_{i,j}(x)=0$ is solved, thereby making it possible to determine the parameters of the vector x that minimize the error between the simulated reflectogram and the measured reflectogram.

The derivative F'(x) at the point x is then calculated numerically, and then the value of the vector x is deduced therefrom in the following iteration from equation (3).

From the new values of the numerical parameters, the new reflectograms associated with the following iteration are then determined therefrom by looping back to step 303.

A description is now given of a third embodiment of the invention, which is again based on a genetic optimization algorithm.

Figure 5:
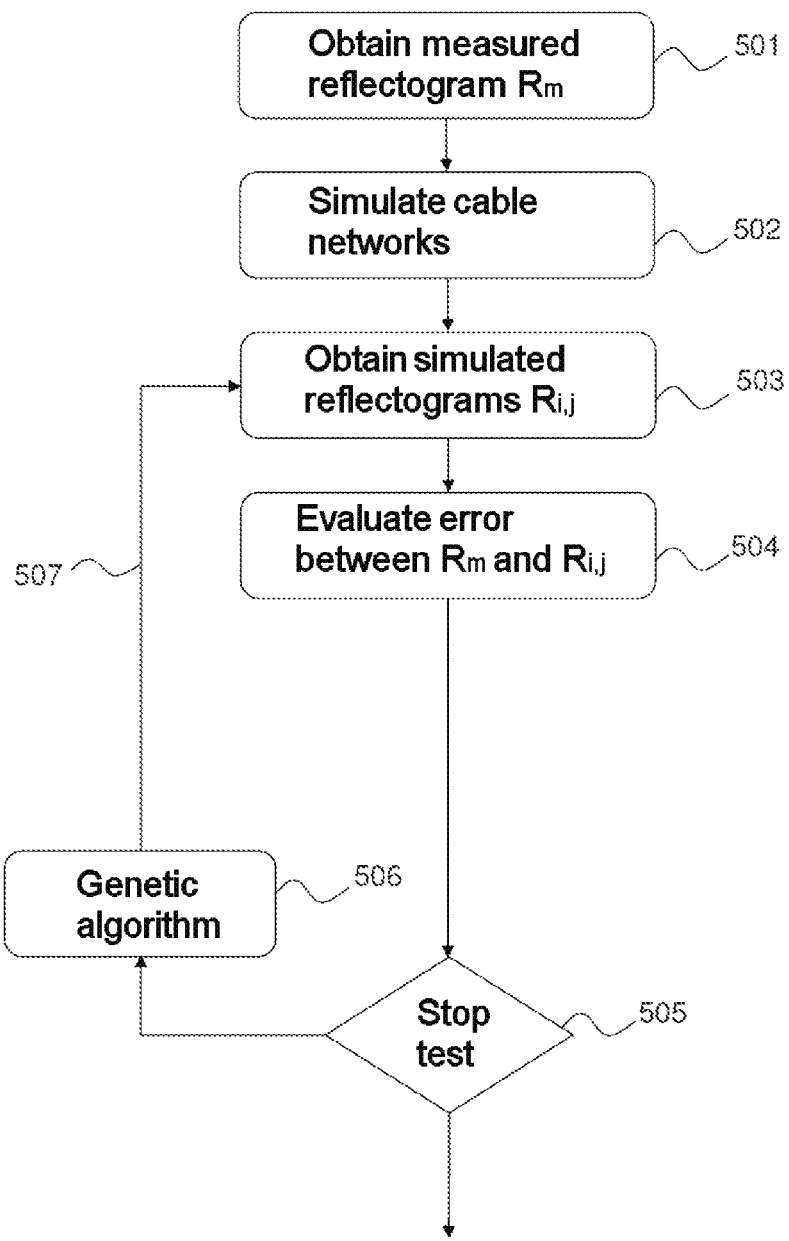
FIG. 5 shows a flowchart detailing the steps for implementing a method for reconstructing the topology of a cable network, according to a third embodiment of the invention.

FIG. 5 outlines, in a flowchart, the steps for implementing the method according to a third embodiment of the invention.

The first step 501 of the third embodiment is identical to the first step 301 of the first embodiment. It consists in obtaining a measured reflectogram $R_m$ at a point of a cable network whose topology it is desired to determine.

The second step 502 of the third embodiment is comparable to the second step 302 of the first embodiment, with one difference. The number of network hypotheses simulated in step 502 is significantly lower than the number of network hypotheses simulated in step 302. It is no longer necessary for the set of simulated network hypotheses to run through all of the possible structural topology parameters. Conversely, it is enough to simulate a sample containing a limited number of network hypotheses having different structural topology parameters and different numerical topology parameters.

This step has the advantage of limiting the number of operations and amount of memory space necessary to simulate the cable network hypotheses. The set of hypotheses is chosen so as to be representative of the set of possible networks.

The third step 503 of the third embodiment is identical to the third step 303 of the first embodiment. It consists in determining a simulated time reflectogram for each topology hypothesis simulated in step 502. The number of operations and amount of memory space required to perform step 503 is also reduced in comparison with the first variant embodiment of the method.

The fourth step 504 of the third embodiment is identical to the third step 304 of the first embodiment. It consists in calculating, for each simulated topology hypothesis, an error criterion between the measured reflectogram $R_m$ obtained in step 301 and the reflectogram $R_{i,j}$ of the simulated network.

Step 305 of the first embodiment is omitted in the third embodiment.

The stop test 505 put in place for the third embodiment is identical to the stop test 306 used for the first embodiment.

The method according to the third embodiment comprises applying 506 a genetic optimization algorithm. However, the implementation of this algorithm differs somewhat between the first embodiment and the third embodiment of the invention.

In this third variant, in each iteration of the method, a certain percentage or number of simulated networks that are not modified by the genetic algorithm are retained. The unmodified simulated networks are those that have the lowest error criterion from among the set of simulated networks available at the input of step 506. The percentage of unmodified simulated networks is for example between 5% and 10%.

Then, the rest of the simulated networks, that is to say those that are not kept the same, are modified through a crossover. If N denotes the number of simulated networks at the input of the genetic algorithm, the number of modified networks at output is always equal to N. In other words, the size of the population of network hypotheses is not modified by the genetic algorithm. To obtain a modified network at the output of the genetic algorithm, two simulated networks are selected at the input of the genetic algorithm, these being designated parent networks. The two parent networks are crossed over in order to obtain a child network. The parent networks are drawn at random from among the set of simulated networks at the input of the genetic algorithm. In one particular variant of the invention, the random draw is non-uniform. Each simulated network is assigned a weight that is inversely proportional to its error criterion. Thus, a simulated network having a low error criterion will have a higher probability of being selected as parent network than a simulated network having a high error criterion. In this way, the simulated networks having a weak resemblance to the real network will be gradually eliminated during the iterations of the method.

When two simulated networks are selected as candidate parent networks for a crossover, a crossover function or operation is applied thereto in order to obtain a modified child network. This operation is repeated until a number of modified child networks is obtained that is identical to the number of simulated networks at the input of the genetic algorithm, excluding the simulated networks that are kept the same from one iteration to another.

As explained for step 305 of the first embodiment of the invention, the crossover operation may be applied to numerical values by linearly combining these values. For step 406 of the third embodiment, the crossover operation is also applied to the nodes or junctions of the networks as well as to the branches connected to these junctions. The branches of a network may be identified by the nodes at their endpoints. A child network consists of some of the branches of a first parent network and some of the branches of a second parent network. In this case too, the weight assigned to a parent network may be taken into account for the crossover operation. Thus, if the first parent network has a weight greater than the weight of the second parent network, the first parent network has a higher probability of transmitting its branches to the child network than the second parent network. To construct a child network, a random draw, possibly weighted by the respective weights of the two parent networks, is performed from the set of branches of the two parent networks. The child network is constructed by concatenating the branches of the two parent networks that are selected by this random draw. If the child network does not comply with the global constraints of the network that is sought, then it is eliminated and the crossover operation is repeated. A child network may be eliminated notably if the number of branches that is obtained is greater than a maximum possible number of branches or if the number of junctions that is obtained is greater than a maximum possible number of junctions or else if the network that is obtained is not continuous, that is to say that it consists of at least two sub-graphs that are not connected to one another.

Figure 6A:
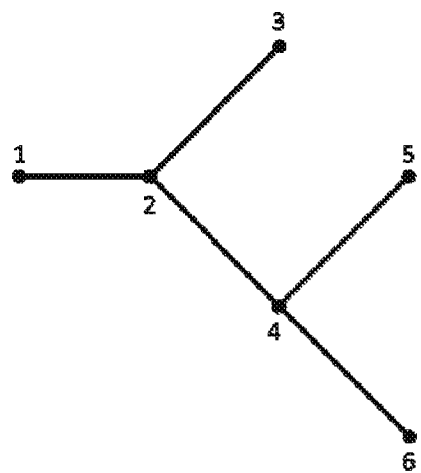
FIGS. 6a, 6b and 6c show three illustrations of an operation of crossing over two networks having different topologies.
Figure 6A:
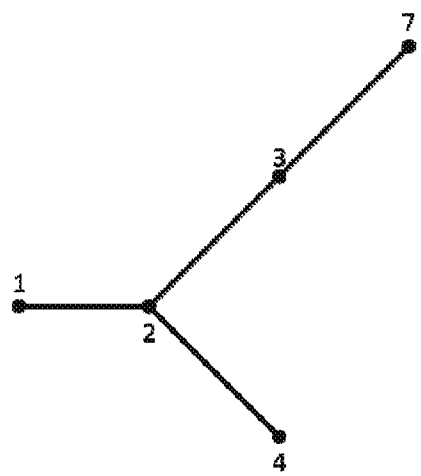
Figure 6B:
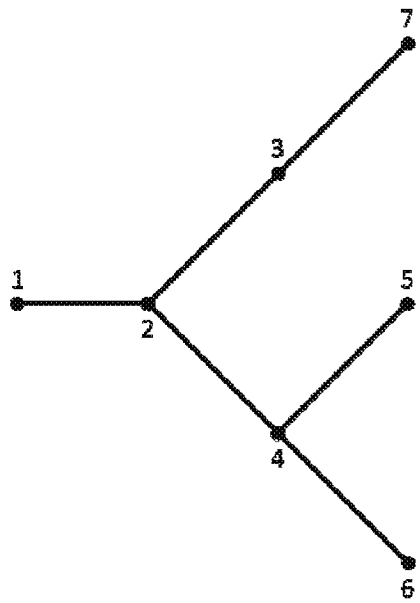
Figure 6B:
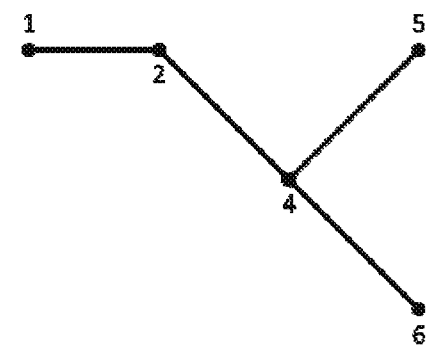

FIGS. 6a and 6b illustrate two examples of the crossover of two parent networks.

FIG. 6a shows two parent networks of different topologies. The first network, shown on the left in FIG. 5a, comprises five branches that may be identified by the numbers of their respective endpoints: 1-2, 2-3, 2-4, 4-5 and 4-6. The second network, shown on the right in FIG. 5a, comprises four branches: 1-2, 2-3, 2-4 and 3-7. Identical nodes between the two networks are numbered the same way. In general, all of the simulated networks always comprise a first branch 1-2, the first endpoint 1 of which corresponds to the point at which the reflectometry signal is injected and measured.

FIG. 6b shows two examples of child networks each obtained by a different crossover of the two parent networks of FIG. 6a. The child network shown on the left in FIG. 6b has inherited all of the branches of the two parent networks. The child network shown on the right in FIG. 6b has inherited only some of the branches of each of the two parent networks. Generally, each of the two child networks is obtained by a random draw from among the set of branches of the two parent networks. The weights assigned to the two parent networks may be taken into account in the random draw in order to give priority to the selection of the branches of the parent network that is closest to the real network.

The above examples are given by way of illustration and are in no way limiting.

Figure 6C:
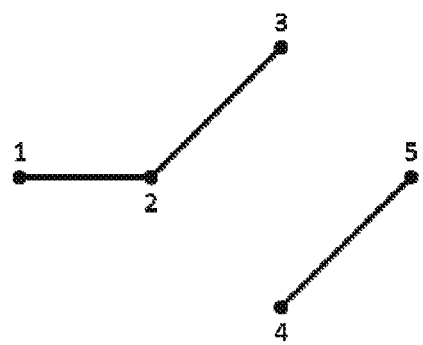

FIG. 6c shows a possible child network obtained by crossing over the two parent networks of FIG. 6a. This child network comprises two sub-graphs that are not connected to one other, respectively the sub-graph 1-2, 2-3 and the sub-graph 4-5. As this network is not acceptable, it is eliminated and the crossover operation is repeated until an acceptable network is obtained.

The crossover operation is performed on at least one parameter defining a simulated network from among the branches, the branch lengths, the characteristic impedances of the branches and the impedances of the loads at the endpoint of the branches. For example, when two parent networks are selected to be crossed over, the crossover operation may be carried out on one or more or all of the structural parameters and/or the numerical parameters of the topology. In another example, different parent networks may be selected to perform a crossover on the basis of structural parameters and a crossover on the basis of numerical parameters, respectively.

When all of the child networks are obtained, step 506 may also comprise a substep of mutation of a small percentage, typically less than 1%, of the modified networks obtained through a crossover. To apply a mutation to a simulated network topology, one of the parameters that defines the network from among the branches, the branch lengths, the characteristic impedances of the branches and the impedances of the loads at the endpoint of the branches is modified. Modifying a branch of the network corresponds either to the elimination of a branch or to the addition of a new branch connected to a junction.

The modified networks obtained at the output of the genetic algorithm 506 replace 507 the simulated networks from the previous iteration in the next iteration, and the method loops back to step 504.

A description is now given of another variant embodiment of the invention that is applicable to all the above-described embodiments of the invention. In this variant, it is assumed that the endpoints of the network whose topology it is desired to reconstruct are known and accessible. In this case, the impedances of the loads at the endpoints are no longer considered in the topology parameters to be sought.

In a preliminary step, not shown in FIGS. 3 and 5, a first reflectometry measurement $R_{m,a}$ is performed on the cable network whose endpoints are connected to loads matched to the cables. For such a network, there is no reflection of the signal off the endpoints of the cables, thereby making it possible to simplify the analysis of the reflectogram and to directly reconstruct the first two junctions of the network as well as the lengths of the branches between these two junctions.

By virtue of this preliminary step, the number of network hypotheses to be simulated in the second step 302, 502 of the method is reduced.

In a second step, the method is applied according to one of the embodiments described above by performing a second reflectometry measurement $R_{m,o}$ the same network without the loads matched to the endpoints of the network, that is to say endpoints in an open circuit.

This second reflectometry measurement is used as an entry point for the method and corresponds to the first step 301, 501.

The various embodiments of the invention that have been described have in common the use of an optimization algorithm that has the function of modifying the simulated cable network hypotheses so as to improve the global error criterion of the set of hypotheses at each iteration.

The method according to the invention may be implemented as a computer program, the method being applied to a reflectometry measurement $R_m$ previously acquired using a conventional reflectometry device. The invention may be implemented as a computer program comprising instructions for the execution thereof. The computer program may be recorded on a recording medium that is able to be read by a processor. The reference to a computer program that, when it is executed, performs any one of the previously described functions is not limited to an application program running on a single host computer. On the contrary, the terms computer program and software are used here in a general sense to refer to any type of computer code (for example, application software, firmware, microcode, or any other form of computer instruction) that may be used to program one or more processors so as to implement aspects of the techniques described here. The computing means or resources may notably be distributed ("cloud computing"), possibly using peer-to-peer technologies. The software code may be executed on any suitable processor (for example a microprocessor) or processor core or a set of processors, whether they are provided in a single computing device or distributed between several computing devices (for example such as possibly accessible in the environment of the device). The executable code of each program allowing the programmable device to implement the processes according to the invention may be stored for example in the hard disk or in read-only memory. Generally speaking, the program or programs may be loaded into one of the storage means of the device before being executed. The central unit is able to command and direct the execution of the instructions or software code portions of the program or programs according to the invention, which instructions are stored in the hard disk or in the read-only memory or else in the other abovementioned storage elements.

Figure 1:
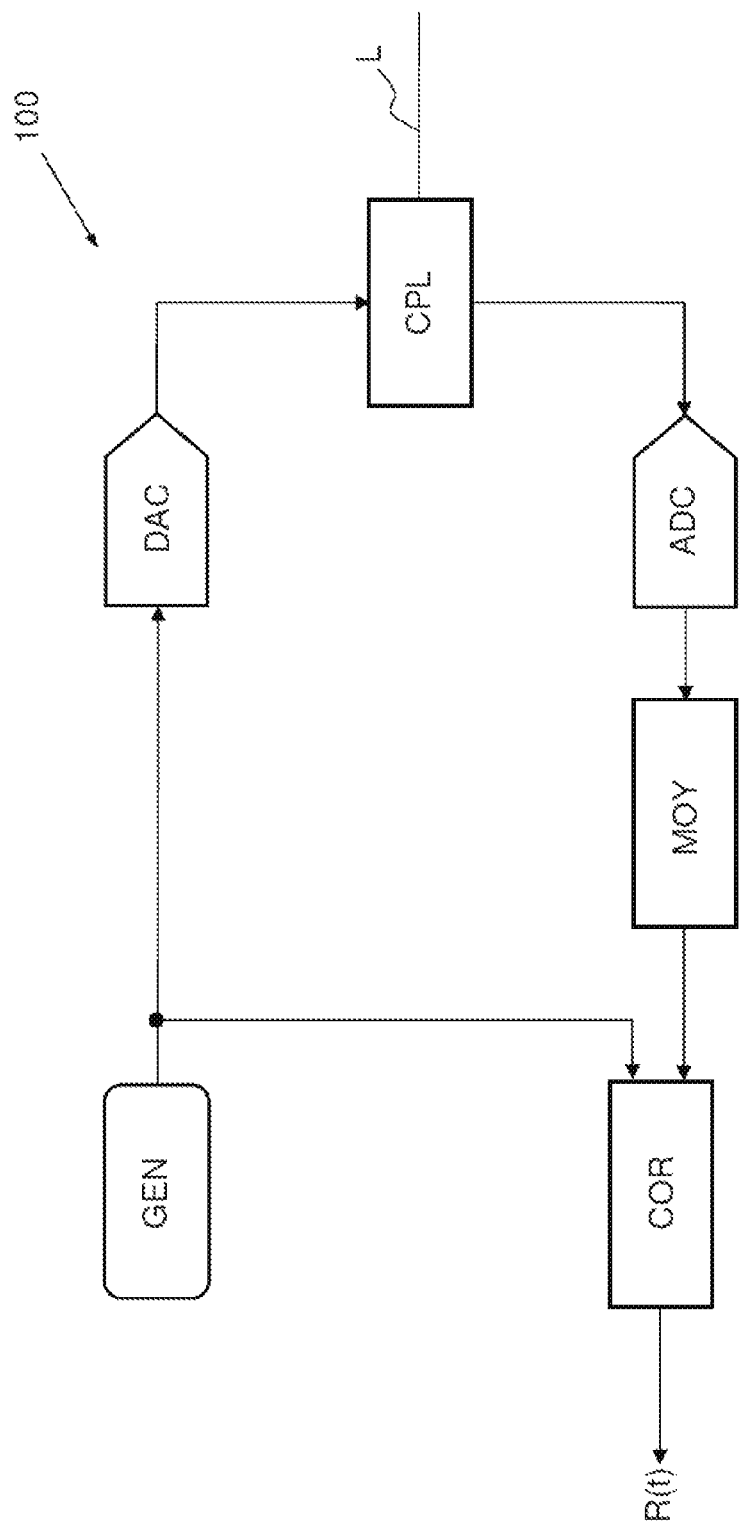
FIG. 1 shows a diagram of a reflectometry system according to the prior art.
Figure 2A:
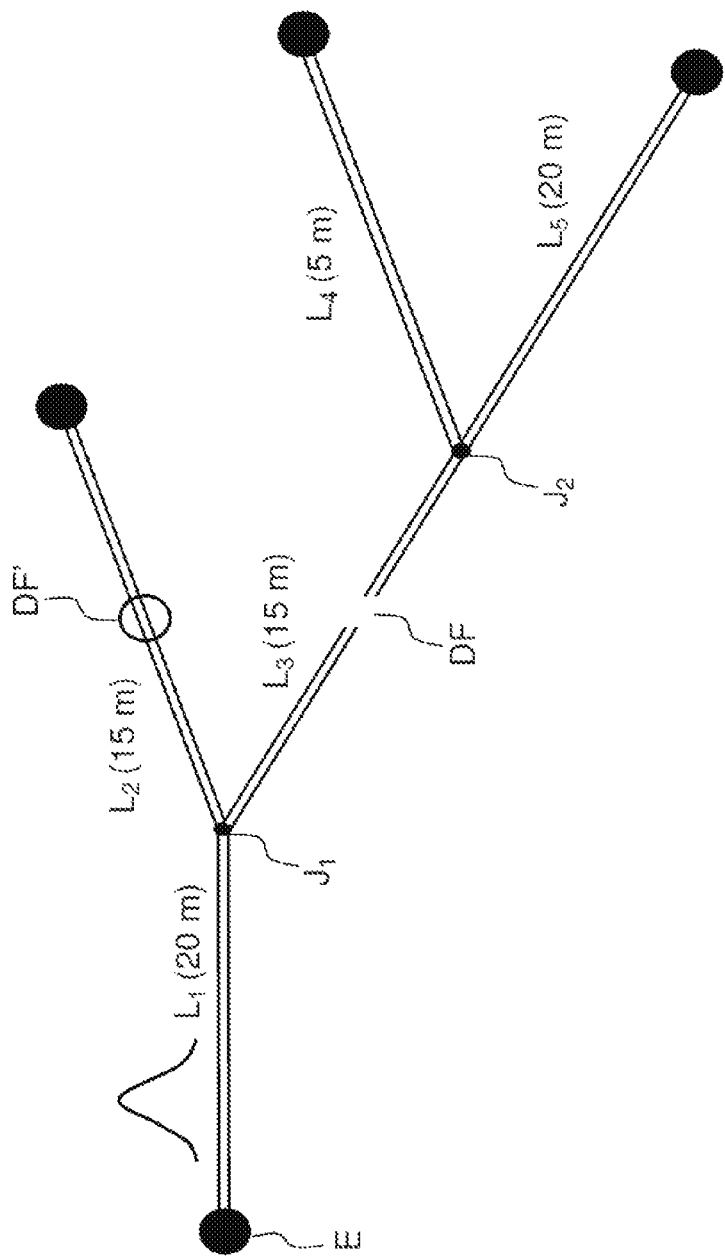
FIG. 2a shows an example of a cable network comprising a plurality of branches and junctions.

As an alternative, the invention may also be implemented in an on-board device of the type in FIG. 1 furthermore comprising a computer configured so as to execute the method according to the invention in order to provide one or more probable topologies of the network under test from a measured reflectogram $R_m$. The device may also comprise a means for displaying the results of the method in the form of a graph or in numerical form.

REFERENCES

[1]: "Algorithmes génétiques" [Genetic algorithms], Selvaraj Ramkumar, Apr. 26, 2007.
[2]: R. Fletcher, "Practical methods of optimization", John Wiley & Sons, 2013.

The invention claimed is:

1. A computer-implemented iterative method for automatically reconstructing a topology of a cable network, the method comprising the steps of:
  measuring, with a measurement device, a time reflectogram $R_m$ from a signal previously injected into a cable network, the cable network comprising one or more branches, cables, end points, and loads;
  executing, with a processor, the iterative steps of:
    initially simulating with a processor a plurality of possible cable network hypotheses ($H_{ij}$), and then iteratively executing the following steps:
    obtaining with the processor, for each of the plurality of possible cable network hypothesis ($H_{ij}$), an associated initial simulated time reflectogram $R_{ij}$,
    evaluating with the processor, for each of the plurality of the possible cable network hypothesis ($H_{ij}$), a point to point error criterion $E(R_{ij}-R_m)$ between the measured time reflectogram Rm and the associated initial simulated time reflectogram $R_{ij}$ to eliminate any possible cable network hypothesis ($H_{ij}$) having an error exceeding a first error threshold,
    applying with the processor to remaining ones of the plurality of possible cable networks hypothesis ($H_{ij}$), a genetic optimization algorithm to generate a plurality of modified simulated cable network hypothesis ($H_{ij}$) having a reduced point to point error criterion $E(R_{ij}-R_m)$ compared to the point to point error criterion evaluated from the plurality of possible cable network hypothesis ($H_{ij}$) initially simulated, replacing, with the processor, said possible cable networks hypothesis ($H_{ij}$) from a previous iteration with said plurality of modified simulated cable networks hypothesis ($H_{ij}$) for a following iteration, and comparing with the processor the point to point error criterion $E(R_{ij}-R_m)$ of each of the plurality of modified simulated cable network hypothesis ($H_{ij}$) with a predetermined second threshold and, when the processor determines at least one of the plurality of modified simulated cable network hypothesis ($H_{ij}$) has an error criterion lower than said predetermined second threshold, stopping the iterative steps, and displaying the reconstructed topology of the at least one of the plurality of modified simulated cable network hypothesis ($H_{ij}$) on a display device, the reconstructed topology displayed on the display device providing information for diagnosis of the cable network including fault location and/or fault identification and to assist in and/or repair of the cable network, and repairing the cable network based on said displayed reconstructed topology, wherein the genetic optimization algorithm comprises at least one operation of crossing over two simulated cable networks to obtain a modified cable network, a crossover being applied to a structural topology parameters and numerical topology parameters of a cable network.

2. The iterative method for reconstructing the topology of a cable network as claimed in claim 1, wherein the point to point error criterion is a Euclidean distance.

3. The iterative method for reconstructing the topology of a cable network as claimed in claim 1, the method further comprising:
a preliminary step of injecting the signal into the cable network.

4. A non-transitory computer readable medium containing computer instructions stored therein for causing a processor to perform a method for automatically reconstructing a topology of a cable network, the method comprising the steps of:

measuring, with a measurement device, a time reflectogram Rm from a signal previously injected into a cable network, the cable network comprising one or more branches, cables, end points, and loads;

executing, with a processor, the iterative steps of:
initially simulating with a processor a plurality of possible cable network hypotheses ($H_{ij}$), and then iteratively executing the following steps:

obtaining with the processor, for each of the plurality of possible cable network hypothesis ($H_{ij}$), an associated initial simulated time reflectogram $R_{ij}$, evaluating with the processor, for each of the plurality of the possible cable network hypothesis ($H_{ij}$), a point to point error criterion $E(R_{ij}-R_m)$ between the measured time reflectogram Rm and the associated initial simulated time reflectogram $R_{ij}$ to eliminate any possible cable network hypothesis ($H_{ij}$) having an error exceeding a first error threshold, applying with the processor to remaining ones of plurality of the possible cable networks hypothesis ($H_{ij}$), a genetic optimization algorithm to generate a plurality of modified simulated cable network hypothesis ($H_{ij}$) having numerical parameters that evolve toward a most likely set of numerical parameters, replacing with the processor, said possible cable networks hypothesis ($H_{ij}$) from a previous iteration with said plurality of modified simulated cable networks hypothesis ($H_{ij}$) for a following iteration, and comparing with the processor the point to point error criterion $E(R_{ij}-R_m)$ of each of the plurality of modified simulated cable network hypothesis ($H_{ij}$) with a predetermined second threshold and, when the processor determines at least one of the plurality of modified simulated cable network hypothesis ($H_{ij}$) has an error criterion lower than said predetermined second threshold, stopping the iterative steps, and displaying the reconstructed topology of the at least one of the plurality of modified simulated cable network hypothesis ($H_{ij}$) on a display device, the reconstructed topology displayed on the display device providing information for diagnosis of the cable network including fault location and/or fault identification and repair of the cable network based on said displayed reconstructed topology, and repairing the cable network based on said displayed reconstructed topology, wherein the genetic optimization algorithm comprises at least one operation of crossing over two simulated cable networks to obtain a modified cable network, a crossover being applied to a structural topology parameters and numerical topology parameters of a cable network.

5. A non-transitory computer readable medium containing computer instructions stored therein for causing a processor to perform a method for reconstructing a topology of a cable network, the method comprising the steps of:

measuring, with a measurement device, a time reflectogram Rm from a signal previously injected into a cable network, the cable network comprising one or more branches, cables, end points, and loads;

executing, with a processor, the iterative steps of:
initially simulating with a processor a plurality of possible cable network hypotheses ($H_{ij}$), and then iteratively executing the following steps:

obtaining with the processor, for each of the plurality of possible cable network hypothesis ($H_{ij}$), an associated initial simulated time reflectogram Rij, evaluating with the processor, for each of the plurality of the possible cable network hypothesis ($H_{ij}$), a point to point error criterion $E(R_{ij}-R_m)$ between the measured time reflectogram Rm and the associated initial simulated time reflectogram $R_{ij}$ to eliminate any possible cable network hypothesis ($H_{ij}$) having an error exceeding a first error threshold, applying with the processor to remaining ones of plurality of the possible cable networks hypothesis ($H_{ij}$), a genetic optimization algorithm to generate a plurality of modified simulated cable network hypothesis ($H_{ij}$) having numerical parameters that evolve toward a most likely set of numerical parameters, replacing with the processor, said possible cable networks hypothesis ($H_{ij}$) from a previous iteration with said plurality of modified simulated cable networks hypothesis ($H_{ij}$) for a following iteration, and comparing with the processor the point to point error criterion $E(R_{ij}-R_m)$ of each of the plurality of modified simulated cable network hypothesis ($H_{ij}$) with a predetermined second threshold and, when the processor determines at least one of the plurality of modified simulated cable network hypothesis ($_{ij}$) has an error criterion lower than said predetermined second threshold, stopping the iterative steps, and displaying the reconstructed topology of the at least one of the plurality of modified simulated cable network hypothesis ($H_{ij}$) on a display device, the reconstructed topology displayed on the display device providing information for diagnosis of the cable network including fault location and/or fault identification and repair of the cable network based on said displayed reconstructed topology, and repairing the cable network based on said displayed reconstructed topology, wherein P simulated cable networks that have a lowest error criteria are not modified by the genetic optimization algorithm, P being a predetermined integer at least equal to one.

6. A computer-implemented iterative method for automatically reconstructing a topology of a cable network, the method comprising the steps of:

measuring, with a measurement device, a time reflectogram $R_m$ from a signal previously injected into a cable network, the cable network comprising one or more branches, cables, end points, and loads;

executing, with a processor, the iterative steps of:
initially simulating with a processor a plurality of possible cable network hypotheses ($H_{ij}$), and then iteratively executing the following steps:

obtaining with the processor, for each of the plurality of possible cable network hypothesis ($H_{ij}$), an associated initial simulated time reflectogram $R_{ij}$, evaluating with the processor, for each of the plurality of possible cable network hypothesis ($H_{ij}$), a point to point error criterion $E(R_{ij}-R_m)$ between the measured time reflectogram Rm and the associated initial simulated time reflectogram $R_{ij}$ to eliminate any simulated cable network hypothesis ($H_{ij}$) having an error exceeding a first error threshold, applying with the processor to said simulated cable networks hypothesis ($H_{ij}$), a genetic optimization algorithm to generate a plurality of modified simulated cable network hypothesis ($H_{ij}$) having a reduced point to point error criterion $E(R_{ij}-R_m)$ compared to the point to point error criterion evaluated from the possible cable network hypothesis ($H_{ij}$) initially simulated, replacing with the processor, said possible cable networks hypothesis ($H_{ij}$) from a previous iteration with said plurality of modified simulated cable networks hypothesis ($H_{ij}$) for a following iteration, and comparing with the processor the point to point error criterion $E(R_{ij}-R_m)$ of each of the plurality of modified simulated cable network hypothesis ($H_{ij}$) with a predetermined second threshold and, when the processor determines at least one of the plurality of modified simulated cable network hypothesis ($H_{ij}$) has an error criterion lower than said predetermined second threshold, stopping the iterative steps, and displaying the reconstructed topology of the at least one of the plurality of modified simulated cable network hypothesis ($H_{ij}$) on a display device, using the reconstructed topology displayed on the display device to provide information for diagnosis of the cable network including fault location and/or fault identification, and repairing the cable network based on the displayed reconstructed topology, wherein P simulated cable networks that have a lowest error criteria are not modified by the genetic optimization algorithm, P being a predetermined integer at least equal to one.

7. A computer-implemented iterative method for automatically reconstructing a topology of a cable network, the method comprising the steps of:

measuring, with a measurement device, a time reflectogram Rm from a signal previously injected into a cable network, the cable network comprising one or more branches, cables, end points, and loads;

executing, with a processor, the iterative steps of:
initially simulating with a processor a plurality of possible cable network hypotheses ($H_{ij}$), and then iteratively executing the following steps:

obtaining with the processor, for each of the plurality of possible cable network hypothesis ($H_{ij}$), an associated initial simulated time reflectogram $R_{ij}$, evaluating with the processor, for each of the plurality of the possible cable network hypothesis ($H_{ij}$), a point to point error criterion $E(R_{ij}-R_m)$ between the measured time reflectogram Rm and the associated initial simulated time reflectogram $R_{ij}$ to eliminate any simulated cable network hypothesis ($H_{ij}$) having an error exceeding a first error threshold, applying with the processor to said simulated cable networks hypothesis ($H_{ij}$), a genetic optimization algorithm to generate a plurality of modified simulated cable network hypothesis ($H_{ij}$) having a reduced point to point error criterion $E(R_{ij}-R_m)$ compared to the point to point error criterion evaluated from the possible cable network hypothesis ($H_{ij}$) initially simulated, replacing with the processor, said possible cable networks hypothesis ($H_{ij}$) from a previous iteration with said plurality of modified simulated cable networks hypothesis ($H_{ij}$) for a following iteration, and comparing with the processor the point to point error criterion $E(R_{ij}-R_m)$ of each of the plurality of modified simulated cable network hypothesis ($H_{ij}$) with a predetermined second threshold and, when the processor determines at least one of the plurality of modified simulated cable network hypothesis ($H_{ij}$) has an error criterion lower than said predetermined second threshold, stopping the iterative steps, and displaying the reconstructed topology of the at least one of the plurality of modified simulated cable network hypothesis ($H_{ij}$) on a display device, using the reconstructed topology displayed on the display device to provide information for diagnosis of the cable network including fault location and/or fault identification, and repairing the cable network based on the reconstructed topology, wherein the genetic optimization algorithm comprises at least one operation of crossing over two simulated cable networks to obtain a modified cable network, a crossover being applied only to numerical topology parameters of a cable network.

8. A computer-implemented iterative method for automatically reconstructing a topology of a cable network, the method comprising the steps of:

measuring, with a measurement device, a time reflectogram Rm from a signal previously injected into a cable network, the cable network comprising one or more branches, cables, end points, and loads;

executing, with a processor, the iterative steps of:

initially simulating with a processor a plurality of initial simulated cable network hypotheses ($H_{ij}$), and then iteratively executing the following steps:

obtaining with the processor, for each of the plurality of initial simulated cable network hypothesis ($H_{ij}$), an associated initial simulated time reflectogram $R_{ij}$, evaluating with the processor, for each of the plurality of the initial simulated cable network hypothesis ($H_{ij}$), a point to point error criterion $E(R_{ij}\text{-Rm})$ between the measured time reflectogram Rm and the associated initial simulated time reflectogram Rj Rij to eliminate any initial simulated cable network hypothesis ($H_{ij}$) having an error exceeding a first error threshold, applying with the processor to said remaining ones of plurality of the initial simulated cable networks hypothesis ($H_{ij}$), a genetic optimization algorithm to generate a plurality of modified simulated cable network hypothesis ($H_{ij}$) having numerical parameters that evolve toward a most likely set of numerical parameters, replacing with the processor, said initial simulated cable networks hypothesis ($H_{ij}$) ($H_{ij}$) from a previous iteration with said plurality of modified cable networks hypothesis ($H_{ij}$) for a following iteration, and comparing with the processor the point to point error criterion $E(R_{ij}\text{-}R_m)$ of each of the plurality of modified simulated cable network hypothesis ($H_{ij}$) with a predetermined second threshold and, when the processor determines at least one of the plurality of modified simulated cable network hypothesis ($H_{ij}$) has an error criterion lower than said predetermined second threshold, stopping the iterative steps, and displaying the reconstructed topology of the at least one of the plurality of modified simulated cable network hypothesis ($H_{ij}$) on a display device, the reconstructed topology displayed on the display device providing information for diagnosis of the cable network and/or repair of the cable network, wherein the genetic optimization algorithm comprises at least one operation of crossing over two simulated cable networks to obtain a modified cable network, a crossover being applied to a structural topology parameters and numerical topology parameters of a cable network; and wherein the cable network is repaired based on the displayed reconstructed topology and the information provided by the reconstructed topology displayed on the display device including the fault location and/or the fault identification.

* * * * *

UNITED STATES PATENT AND TRADEMARK OFFICE
CERTIFICATE OF CORRECTION

| | | |
|---|---|---|
| PATENT NO. | : 12,158,488 B2 | Page 1 of 1 |
| APPLICATION NO. | : 16/636625 | |
| DATED | : December 3, 2024 | |
| INVENTOR(S) | : Jaume Benoit et al. | |

It is certified that error appears in the above-identified patent and that said Letters Patent is hereby corrected as shown below:

In the Claims

In Claim 1, Column 14, Line 58, "reflectogram Rm and the associated" should be -- reflectogram $R_m$ and the associated --.
In Claim 4, Column 15, Line 47, "a time reflectogram Rm from a signal" should be -- a time reflectogram $R_m$ from a signal --.
In Claim 4, Column 15, Line 60, "reflectogram Rm and the associated" should be -- reflectogram $R_m$ and the associated --.
In Claim 5, Column 16, Line 36, "a time reflectogram Rm from a signal" should be -- a time reflectogram $R_m$ from a signal --.
In Claim 5, Column 16, Line 49, "a time reflectogram Rm and the associated" should be -- a time reflectogram $R_m$ and the associated --.
In Claim 5, Column 17, Line 2, "cable network hypothesis ($_{ij}$) has an error" should be -- cable network hypothesis ($H_{ij}$) has an error --.
In Claim 6, Column 17, Line 36, "reflectogram Rm and the associated" should be -- reflectogram $R_m$ and the associated --.
In Claim 7, Column 18, Line 9, "a time reflectogram Rm from a signal" should be -- a time reflectogram $R_m$ from a signal --.
In Claim 7, Column 18, Line 23, "reflectogram Rm and the associated" should be -- reflectogram $R_m$ and the associated --.
In Claim 8, Column 18, Line 64, "a time reflectogram Rm from a signal" should be -- a time reflectogram $R_m$ from a signal --.
In Claim 8, Column 19, Line 10, "reflectogram Rm and the associated" should be -- reflectogram $R_m$ and the associated --.
In Claim 8, Column 19, Line 11, "time reflectogram Rj Rij to eliminate" should be -- time reflectogram $R_{ij}$ to eliminate --.
In Claim 8, Column 19, Line 22, "networks hypothesis ($H_{ij}$) ($H_{ij}$) from a previous" should be -- networks hypothesis ($H_{ij}$) from a previous --.

Signed and Sealed this
Twenty-eighth Day of January, 2025

Coke Morgan Stewart
*Acting Director of the United States Patent and Trademark Office*